(12) United States Patent
Federico et al.

(10) Patent No.: US 6,594,817 B2
(45) Date of Patent: Jul. 15, 2003

(54) RETICLE EXPOSURE MATRIX

(75) Inventors: John T. Federico, Wappingers Falls, NY (US); Perry G. Hartswick, Millbrook, NY (US); Alan C. Thomas, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 09/760,980

(22) Filed: Jan. 16, 2001

(65) Prior Publication Data

US 2002/0133800 A1 Sep. 19, 2002

(51) Int. Cl.$^7$ .............................................. G06F 17/50
(52) U.S. Cl. .............................. 716/19; 716/20; 716/21
(58) Field of Search ...................... 716/4, 7, 11, 18–21; 703/2; 438/6, 128

(56) References Cited

U.S. PATENT DOCUMENTS

| | | | |
|---|---|---|---|
| 3,946,484 A | 3/1976 | Aronstein et al. ............. | 29/25 |
| 4,027,246 A | 5/1977 | Caccoma et al. ........... | 700/121 |
| 4,442,188 A | 4/1984 | Chiang ......................... | 430/5 |
| 4,702,592 A | 10/1987 | Geiger et al. ................ | 355/53 |
| 4,869,998 A | 9/1989 | Eccles et al. ............... | 430/311 |
| 5,191,535 A | 3/1993 | Terao ......................... | 700/121 |
| 5,231,585 A | 7/1993 | Kobayashi et al. ........... | 700/96 |
| 5,439,764 A | 8/1995 | Alter et al. ..................... | 430/5 |
| 5,495,417 A | 2/1996 | Fuduka et al. .............. | 700/121 |
| 5,684,723 A * | 11/1997 | Nakadai ...................... | 716/20 |
| 5,694,325 A | 12/1997 | Fukuda et al. .............. | 700/121 |
| 5,705,299 A | 1/1998 | Tew et al. ..................... | 430/5 |
| 5,768,133 A | 6/1998 | Chen et al. ................... | 700/95 |
| 5,933,350 A | 8/1999 | Fujimoto et al. ........... | 700/121 |
| 5,972,727 A | 10/1999 | Ryan et al. .................... | 438/14 |
| 6,040,892 A | 3/2000 | Pierrat ......................... | 355/53 |
| 6,383,847 B1 * | 5/2002 | Ditlow et al. ............... | 438/128 |

OTHER PUBLICATIONS

IBM Technical Disclosure Bulletin, *Mask Control System*, N. Bakhru, R. B. Herring, R. B. Humphrey and V. Shea, vol. 19, No. 4, Sep. 1976.

\* cited by examiner

*Primary Examiner*—Vuthe Siek
*Assistant Examiner*—Naum Levin
(74) *Attorney, Agent, or Firm*—DeLio & Peterson LLC; Peter W. Peterson; Todd M. C. Li

(57) ABSTRACT

A method for employing a plurality of reusable reticles in an integrated circuit manufacturing process employing lithographic exposure of a semiconductor wafer. Initially there is provided a matrix of a plurality of reticles, each matrix comprising a plurality of tuples of reticles, each reticle tuple comprising one or more reticles. The method then includes defining at least one set of valid groups of reticles in the matrix for use in a desired lithographic exposure process, defining a set of conditions for determining availability of all reticles in the valid groups in the lithographic exposure process, and comparing the availability conditions to the reticles in the set of valid groups and eliminating valid groups which do not meet the availability conditions, leaving non-eliminated valid groups. The method also includes defining a set of conditions for determining priority of all reticles in the non-eliminated valid groups in the lithographic exposure process, comparing the priority conditions to the reticles in the set of valid groups and ranking non-eliminated valid groups according to the priority conditions, and selecting for use in the lithographic exposure process reticles from the non-eliminated valid groups according to ranking by the priority conditions.

24 Claims, 2 Drawing Sheets

RETICLE EXPOSURE MATRIX

BACKGROUND OF THE INVENTION

1. Field of the Invention

The present invention relates to the manufacture of integrated circuit chips and, in particular, to a method and system for handling multiple photomasks or reticles in lithographic processing of wafers to make multiple patterns on the same wafer process level.

2. Description of Related Art

In the logistical and bill-of-material (BOM) systems that are widely used within the semiconductor industry today, the use of durable goods at key levels of production are generally limited to a one-on-one relationship. Durable goods or durables are resources that are reused throughout the manufacturing process, as contrasted with consumable goods which are used up during manufacturing. A specific, non-limiting example of such a durable is a photo mask, also called a reticle, within the lithography areas of a semiconductor manufacturing facility. Masks or reticles are used in lithographic techniques during the manufacture of integrated circuits to define circuit features on a silicon semiconductor wafer. During construction of the mask, a pattern of the circuit features to be exposed onto the wafer is formed on the mask substrate. The pattern of circuit features is made of an absorptive or opaque material which blocks the beam used in the lithographic process. The beam in the lithographic system exposes a suitable sensitized film covering the wafer. When the wafer is exposed, the pattern on the mask is reproduced in the sensitized film. Subsequent processing, such as developing the sensitized film, etching, and the like reproduces the circuit pattern on the mask on the surface of the wafer to define the desired circuit elements.

Present techniques for handling reticles and other durables in lithographic processing are inefficient because they associate a particular physical reticle to a particular chip, thus limiting the use of the reticle. Further, while there is mention in the prior art of using multiple reticles per lithographic process level, for example, in U.S. Pat. No. 4,702,592, such methods are not believed to have been widely used in practice, and have not been able to efficiently use reticles in processing for either research and development or in production.

Bearing in mind the problems and deficiencies of the prior art, it is therefore an object of the present invention to provide a method for handling, employing and controlling the use of multiple durables, e.g., reticles, in integrated circuit chip manufacturing.

Another object of the invention is to provide an improved method for employing durables such as reticles within an integrated circuit manufacturing area.

It is a further object of the present invention to provide a method for handling multiple reticles for use on the same lithographic process level in chip production.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for employing a plurality of reusable durable goods in an integrated circuit manufacturing process which initially comprises providing a matrix of a plurality of durable goods, each matrix comprising a plurality of tuples of durable goods, with each durable goods tuple comprising one or more durable goods. The method includes defining at least one set of valid groups of durable goods in the matrix for use in a desired integrated circuit manufacturing process, defining at least one condition for determining availability of all durable goods in the valid groups in the desired manufacturing process, and comparing the at least one availability condition to the durable goods in the set of valid groups and eliminating valid groups which do not meet the availability condition, leaving non-eliminated valid groups. The method then includes selecting for further comparison or use in the desired integrated circuit manufacturing process durable goods from the non-eliminated valid groups.

In the preferred embodiment described herein, the durable goods comprise lithographic reticles and the reticles from the non-eliminated valid groups are employed in lithographic exposure of a semiconductor wafer.

After eliminating valid groups which do not meet the availability conditions, the method may include defining at least one condition for determining priority of all durable goods in the non-eliminated valid groups in the desired manufacturing process, and comparing the at least one priority condition to the durable goods in the set of valid groups and ranking non-eliminated valid groups according to priority condition. Further, after eliminating valid groups which do not meet the availability conditions, the method may include defining at least one condition for determining priority of all durable goods in the non-eliminated valid groups in the desired manufacturing process, assigning a weight to each condition for determining priority of the durable goods in the non-eliminated valid groups, and comparing the at least one weighted priority conditions to the durable goods in the set of valid groups and ranking non-eliminated valid groups according to weighted priority condition.

Preferably, the method includes a plurality of conditions for determining priority of all durable goods in the non-eliminated valid groups in the desired manufacturing process. The valid groups of durable goods in the matrix may be determined by applying a rule of interpretation which depends on the type of manufacturing process.

In some instances, the durable goods may be identical in each tuple and each tuple contains durable goods different from other tuples, and the set of valid groups of durable goods in the matrix is defined as only one durable good per matrix tuple. In other instances, the durable goods are different in each tuple, and the set of valid groups of durable goods in the matrix is defined as only one matrix tuple in its entirety. In the latter instance, a durable good in one tuple may be identical to one durable good in another tuple.

In another aspect, the present invention relates to a method for employing a plurality of reusable reticles in an integrated circuit manufacturing process employing lithographic exposure of a semiconductor wafer. Initially there is provided a matrix of a plurality of reticles, each matrix comprising a plurality of tuples of reticles, each reticle tuple comprising one or more reticles. The method then includes defining at least one set of valid groups of reticles in the matrix for use in a desired lithographic exposure process, defining a set of conditions for determining availability of all reticles in the valid groups in the lithographic exposure process, and comparing the availability conditions to the reticles in the set of valid groups and eliminating valid groups which do not meet the availability conditions, leaving non-eliminated valid groups. The method also includes defining a set of conditions for determining priority of all reticles in the non-eliminated valid groups in the lithographic exposure process, comparing the priority conditions to the reticles in the set of valid groups and ranking non-eliminated valid groups according to the priority conditions, and selecting for use in the lithographic exposure process reticles from the non-eliminated valid groups according to ranking by the priority conditions.

Preferably, before comparing the priority conditions to the reticles in the set of valid groups, the method includes assigning a weight to each condition for determining priority of the reticles in the non-eliminated valid groups, and comparing the weighted priority conditions to the reticles in the set of valid groups and ranking non-eliminated valid groups according to weighted priority condition. The reticles from the non-eliminated valid groups may be employed in lithographic exposure of a single process level of a semiconductor wafer. The valid groups of reticles in the matrix may be determined by applying a rule of interpretation which depends on the type of manufacturing process.

In one example, the reticles are identical in each tuple and each tuple contains reticles different from other tuples, and the set of valid groups of reticles in the matrix is defined as only one reticle per matrix tuple. In another example, the reticles are different in each tuple, and the set of valid groups of reticles in the matrix is defined as only one matrix tuple in its entirety, and a reticle in one tuple may be identical to one reticle in another tuple.

A further aspect of the present invention provides an article of manufacture comprising a computer usable medium having computer readable program code means embodied therein for employing a plurality of reusable durable goods in an integrated circuit manufacturing process, the plurality of durable goods being provided in a matrix comprising a plurality of tuples of durable goods, each durable goods tuple comprising one or more durable goods. The article comprises computer readable program code means for defining at least one set of valid groups of durable goods in the matrix for use in a desired integrated circuit manufacturing process; computer readable program code means for defining at least one condition for determining availability of all durable goods in the valid groups in the desired manufacturing process; computer readable program code means for comparing the at least one availability condition to the durable goods in the set of valid groups and eliminating valid groups which do not meet the availability condition, leaving non-eliminated valid groups; and computer readable program code means for selecting for further comparison or use in the desired integrated circuit manufacturing process durable goods from the non-eliminated valid groups.

Yet another aspect of the present invention provides a program storage device readable by a machine, tangibly embodying a program of instructions executable by the machine to perform method steps for employing a plurality of reusable durable goods in an integrated circuit manufacturing process, the plurality of durable goods being provided in a matrix comprising a plurality of tuples of durable goods, each durable goods tuple comprising one or more durable goods. The method steps comprise defining at least one set of valid groups of durable goods in the matrix for use in a desired integrated circuit manufacturing process; defining at least one condition for determining availability of all durable goods in the valid groups in the desired manufacturing process; comparing the at least one availability condition to the durable goods in the set of valid groups and eliminating valid groups which do not meet the availability condition, leaving non-eliminated valid groups; and selecting for further comparison or use in the desired integrated circuit manufacturing process durable goods from the non-eliminated valid groups.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

Figure 1:
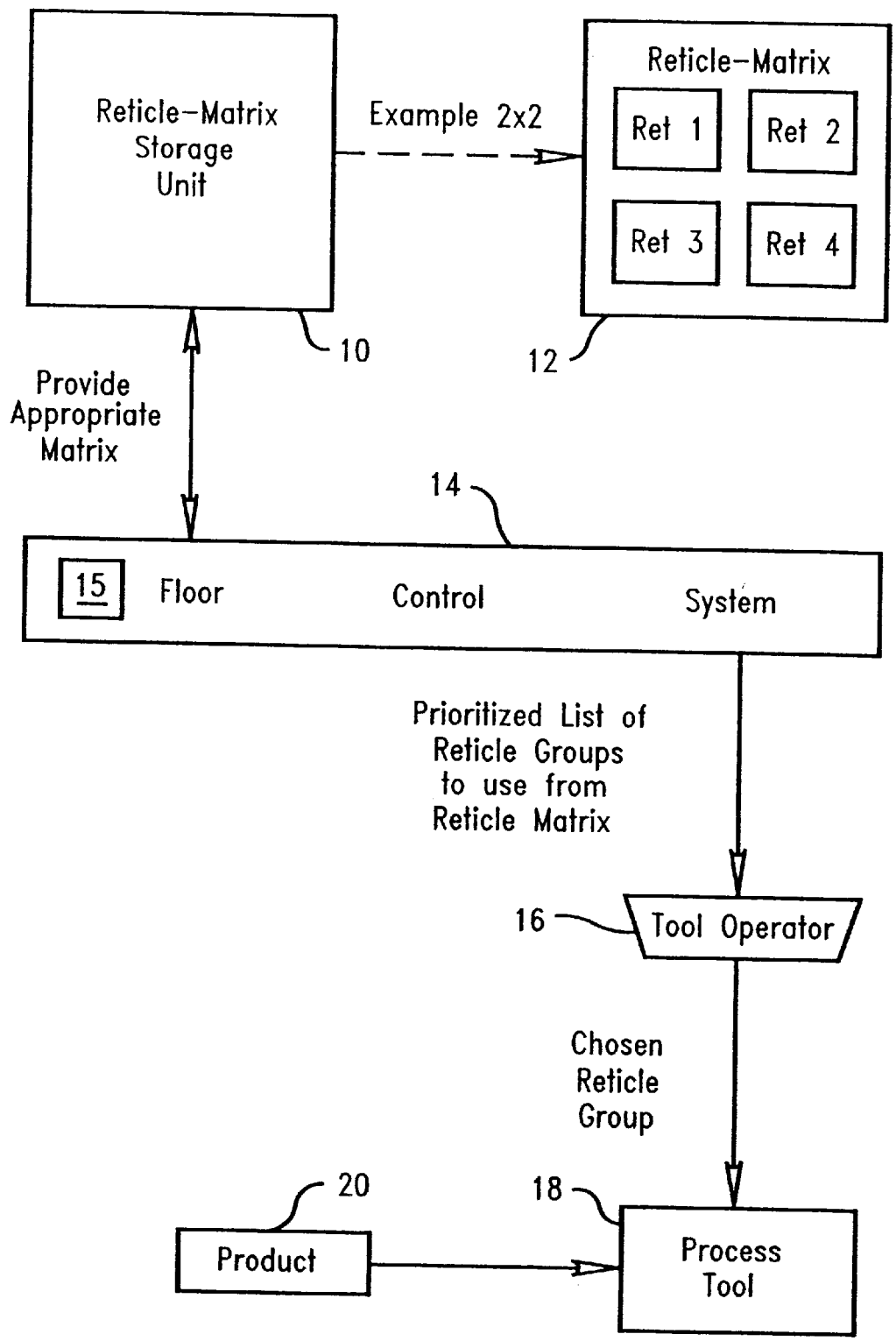
FIG. 1 is a schematic showing use of the present invention in an automated integrated circuit manufacturing control process and system.

In describing the preferred embodiment of the present invention, reference will be made herein to FIGS. 1 and 2 of the drawings in which like numerals refer to like features of the invention. Features of the invention are not necessarily shown to scale in the drawings.

There may be several instances where the use of multiple reticles is required per lithographic process level. Some examples of these instances are: 1) multiple chip types per wafer, 2) alignment marks and clock outs, 3) field stitching and 4) alternating phase shift masks. In the first example where multiple chip types are used per wafer, yield monitor test site drop-in reticles may be used early in the development cycle to allow for high critical area test structures to be processed under the same conditions as product chips. Matched chip sets may also be employed for multiple chip module applications, as it is sometimes desirable to have the critical chips processed together. Also, for very low volume ASICs with small chip sizes, this would allow for different chips to co-exist on the same wafer.

In the second example, global alignment marks may be used to limit distortion problems by separating reticles with the alignment marks placed in the center of the exposure field. At levels where alignment marks are placed, the product and alignment marks are exposed separately. For some processes, it is necessary to clear an area around the alignment marks requiring multiple masks. In the third example, field stitching, chips within new generation technologies sometimes exceed the field size of an exposure tool. Non-critical levels can be made up of two or more individual reticles stitched together by multiple exposure.

Finally, alternating phase shift masks may be employed in situations of unwanted phase transitions which cannot be avoided in the design print loops that short structures together. These loops could then be cleared by double exposure with a trim mask. This applies to other phase doubling techniques as well.

In order to accommodate the above requirements, the present invention provides a method and system to define and use more than one durable, e.g., lithographic processing reticle, in a controlled manner. To extend this example, the definition of multiple reticles at an exposure level, and subsequently, developing a method for interpreting the information to ensure exposures are performed in the proper order.

To accomplish this, the present invention abandons the prior art method of associating a particular physical reticle to a particular chip and creates a completely independent control method for applying such durables. In addition, the present invention preferably employs a new entity, a durable group, which for this example is called a reticle group, which exists between the durable, e.g., a reticle, and the product, e.g., a wafer, which requires processing, e.g., exposure. A Group is defined as a grouping of a plurality of durables, and in this example, a Reticle Group is defined as a grouping of one or more reticles. A method is also disclosed for allowing use of multiple durables groups, for example, multiple reticle groups associated to an exposure level. While reticles are used as the preferred embodiment of the durables, it should be understood that any other durables may be controlled and employed in a similar manner.

The present invention provides an exposure matrix of reticles, which, depending on the purpose of a manufacturing area, can be interpreted primarily in one of two ways. For example, a 2×2 reticle matrix may appear as follows:

| Ret-A | Ret-B | (Reticle Tuple 1) |
| Ret-D | Ret-E | (Reticle Tuple 2) |

Such a matrix may be part of the bill-of-material system in used within the manufacturing area. Such a system may typically be separate from an existing automated control system, and the information within the BOM is typically separate from the actual process. Instead of the BOM being a single entity, specifically, one reticle, the present invention instead utilizes a matrix of any given size such as the 2×2 matrix above.

As shown in FIG. 1, the present invention is integrated into an automated manufacturing control system, for example, the FloorControl system available from International Business Machines Corporation (assignee of the present invention). A reticle matrix storage unit 10 contains one or more matrices of reticles listed for lithographic exposure of wafers in the manufacture of integrated circuit chips. A reticle matrix 12, for example, a 2×2 matrix of reticles, lists the reticles in a plurality of tuples or rows, with each tuple containing at least one, and typically more than one, reticle. The reticles are shown arranged in tuples and columns, with Ret 1 and Ret 2 comprising one tuple and Ret 3 and Ret 4 comprising another tuple. An automated manufacturing control system 14, for example the FloorControl system, receives the appropriate matrix of valid reticle groups for use in a single lithographic process level. Using the method of the present invention, which will be further described below, the automated control system develops a prioritized list of valid reticle groups to use from the reticle matrix. The automated control system includes a microprocessor for executing a stored program which embodies the method of the present invention. Database(s) 15 on one or more program storage devices are accessible by the control system 14, and contains the information on reticle matrices and other information used by the process as described herein. The computer program software incorporating the process steps and instructions described herein may be stored in an otherwise conventional computer usable medium or program storage device to which the client computer has read access, such as a semiconductor chip, a read-only memory, or optical or magnetic media such as a CD-ROM, DVD-ROM, diskette or computer hard drive, which is readable and executable by the client computer. The process steps and instructions are provided in conventional computer readable program code means such as source or program code. The database containing the reticle matrices may be located on the same or different program storage device to which the automated control system has read and write access.

The prioritized list of valid reticle groups is then transferred from control system 14 to a particular tool operator control 16, which then chooses a desired reticle group and physically transfers it to the lithographic process tool 18 for lithographic exposure of the desired process level of wafer product 20.

Initially, a rule of interpretation must be applied to the reticle matrix in order to derive the valid groups that can be used in the process. The preferred method of the present invention employs an elimination check and a priority check of valid reticle groups. More preferably, the priority checks are weighted to determine the order of selection of reticles from the non-eliminated valid groups for use in the lithographic exposure process. For example, G is the set:

$$\{G_1, G_2, G_3, \ldots G_n\}$$

which represents the set of valid groups generated from the matrix by a particular interpretation. An interpretation may be, for example, a production environment where the matrix contains a plurality of groups, each group contains one or more identical reticles, and each group must be used in the particular process level. Another example of an interpretation is from a research and development environment, where the matrix contains a plurality of groups, each group contains one or more different reticles, and only one group must be used in the particular process level. For each individual group $G_x$, R is the set:

$$\{R_1, R_2, R_3, \ldots R_n\}$$

where $R_x$ is an individual reticle within the group. For each $R_x$, there is a status $S_x$ which indicates the availability of the reticle in the group for the lithographic process, as a pass/fail status. For example, while the matrix may list all reticles theoretically able to be used, one or more may be damaged, out for cleaning, currently used elsewhere, or otherwise unavailable at the particular time needed for the particular lithographic process level.

For each individual group $G_x$, there is also a calculated priority $V_x$. E is the set:

$$\{E_1, E_2, E_3, \ldots E_n\}$$

which represents a set of n conditions which must pass for all reticles in a given group to be available to a tool for lithographic exposure. P is the set:

$$\{P_1, P_2, P_3, \ldots P_n\}$$

which represents a set of n conditions which will be used to prioritize the non-eliminated subset of set G which are available to the lithographic tool. Priority conditions may include, for example, load balancing of the reticles in the matrix, i.e., determining how many times each reticle has been used and giving priority to those that have been used least. Another example of priority is current location of the reticle in the manufacturing area, i.e., how close is the reticle physically to the process tool on which it is needed. Other priority schemes may be employed.

Further, for each $P_x$ there is more preferably a weight $W_x$ which identifies the weight of a particular check used to formulate the priority of a given element in set G which has passed all elimination checks in set E. Weight is used to determine the importance of the priority conditions and break a priority value tie, e.g., reticle load balance may be more important than reticle location. The weight is used as a multiplier to the priority value.

Figure 2:
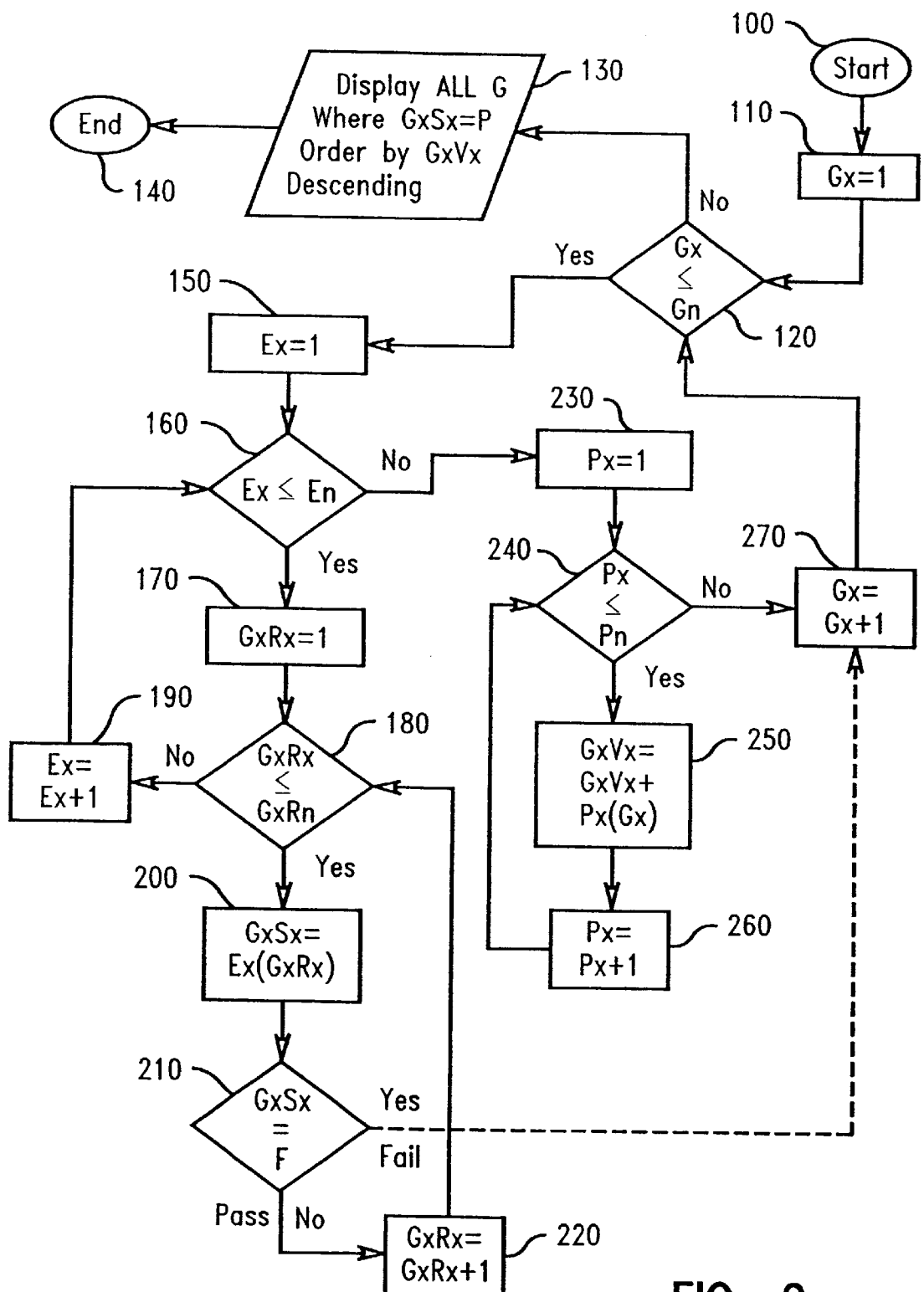
FIG. 2 is a flow chart of a preferred embodiment of the method of the present invention.

The preferred order of operations of the method is shown in the flow chart of FIG. 2. These steps are as follows:

100 Start, and the process continues to step 110.

110 Initialize Valid Group Positional Counter.

120 If there are more Valid Groups to evaluate, the process continues to step 150; if there are no more Valid Groups to evaluate, the process continues to step 130.

130 Display all Valid Groups that have passed Elimination tests and order them with the highest priority group at the top.

140 End process.

150 Initialize Elimination Positional Counter.

160 If there are more Elimination Checks to perform for the current group, the process continues to step 170; if there are no more Elimination Checks, to perform for the current group, the process continues to step 230.

230 Initialize the Prioritization Positional Counter.

240 If there are more Prioritization Methods to call, the process continues to step 250; if there are no more Prioritization Methods to call, the process continues to step 270.

270 Increment the Valid Group Positional Counter, and the process continues to step 120.

250 Call the current Prioritization Method and assign its return value to the Cumulative Priority Value for the entire Group.

260 Increment the Positional Prioritization Counter and the process continues to step 240.

170 Initialize the Reticle Positional Counter for the Group of Reticles being evaluated.

180 If there are more Reticles in the current Group to evaluate, the process continues to step 200; if there are no more Reticles in the current Group to evaluate, the process continues to step 190.

190 Increment the Elimination Positional Counter and the process continues to step 160.

200 Assign the Pass/Fail result of the current Elimination Check to the Status Flag for the Entire Group as it pertains to the current Reticle within the current Reticle Group.

210 If the Group Status is currently Pass, the process continues to step 220; if the Group Status is currently Fail, there is no reason to evaluate remaining Reticles in the group—abort checking the remaining Reticles in the group and the process continues to step 270.

220 Increment the Reticle Positional Counter so the next Reticle can be evaluated, and the process continues to step 180.

EXAMPLE 1

In a first example, there is given a two dimensional matrix of y columns denoted by the set:

$$\{B_1, B_2, B_3, \ldots B_y\}$$

The given matrix is instantiated with x rows denoted by the set:

$$\{A_1, A_2, A_3, \ldots A_x\}$$

The rule of interpretation in this example is that one, and only one, reticle per tuple (row) must be used from each tuple, i.e., reticles within a tuple are identical, and therefore, interchangeable. The set of valid groups is defined as all permutations that conform to the following set:

$$\{<A1, Bz_1>, \ldots <Ax, Bz_x> | z_i \cdot \{1 \ldots y\}\}$$

The matrix of reticles is:

| | | |
|---|---|---|
| Ret 1 | Ret 2 | (Reticles 1 and 2 are identical) |
| Ret 3 | Ret 4 | (Reticles 3 and 4 are identical) |

Therefore, the following permutations of reticles would provide valid groups for exposure:

(Ret 1, Ret 3), (Ret 1, Ret 4), (Ret 2, Ret 3) or (Ret 2, Ret 4)

This situation would be desirable in a manufacturing area where the technology has been proven and is being mass-produced. Unavailable reticles would not hinder production as there would be many identical reticles defined.

The actual permutation chosen would depend on factors such as reticle availability and location. These issues and others related to this determination may be specific to the automated control system being used within the manufacturing area, and are therefore determined by the particular needs of the manufacturing system.

EXAMPLE 2

In a second example, there is again given a two dimensional matrix of y columns denoted by the set:

$$\{B_1, B_2, B_3, \ldots B_y\}$$

The given matrix is again instantiated with x rows denoted by the set:

$$\{A_1, A_2, A_3, \ldots A_x\}$$

However, the rule of interpretation in this example is that one, and only one, tuple (row) from the matrix, and used in its entirety, i.e., reticles within each tuple are different. The set of valid groups is defined as all permutations that conform to the following set:

$$\{\{<A1, B1>, \ldots <A1, By>\}, \ldots \{<Ax, B1>, \ldots <Ax, By>\}\}$$

The matrix of reticles is:

| | | |
|---|---|---|
| Ret 1 | Ret 2 | (Reticles 1 and 2 are different) |
| Ret 3 | Ret 4 | (Reticles 3 and 4 are different) |

Reticle 1 may be identical to either Reticle 3 or Reticle 4. Therefore, the following permutations of reticles would provide valid groups for exposure:

(Ret 1, Ret 2) or (Ret 3, Ret 4)

This situation would be desirable in a manufacturing area where the technology is undergoing research and development. It will allow for a tighter range of possibilities, and will limit the number of variables to examine, should a problem arise within the process.

The actual permutation that is chosen would depend on factors such as reticle availability and location. Again, these issues and others related to this determination may be specific to the automated control system being used within the manufacturing area, and are therefore determined by the particular needs of the manufacturing system.

The present invention offers a significant amount of flexibility as well as provides a more sophisticated use of durables such as reticles within an integrated circuit manufacturing area. In particular, the present invention may efficiently plan for and employ the use of multiple reticles per lithographic process level. Moreover, the same software embodying the present invention may be used by the automated control system may be used for both mass production manufacturing and research and development manufacturing on the same line, simply by changing the rules of interpretation in selecting valid reticle groups.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for employing a plurality of reusable durable goods in an integrated circuit manufacturing process comprising:
   providing a matrix of a plurality of durable goods, each matrix comprising a plurality of tuples of durable goods, each durable goods tuple comprising one or more durable goods;
   defining at least one set of valid groups of durable goods in the matrix for use in a desired integrated circuit manufacturing process;
   defining at least one condition for determining availability of all durable goods in the valid groups in the desired manufacturing process;
   comparing the at least one availability condition to the durable goods in the set of valid groups and eliminating valid groups which do not meet the availability condition, leaving non-eliminated valid groups; and
   selecting for further comparison or use in the desired integrated circuit manufacturing process durable goods from the non-eliminated valid groups.

2. The method of claim 1 wherein the durable goods comprise lithographic reticles and the reticles from the non-eliminated valid groups are employed in lithographic exposure of a semiconductor wafer.

3. The method of claim 1 wherein, after eliminating valid groups which do not meet the availability conditions, the method further includes:
   defining at least one condition for determining priority of all durable goods in the non-eliminated valid groups in the desired manufacturing process; and
   comparing the at least one priority condition to the durable goods in the set of valid groups and ranking non-eliminated valid groups according to priority condition.

4. The method of claim 1 wherein the valid groups of durable goods in the matrix is determined by applying a rule of interpretation which depends on the type of manufacturing process.

5. The method of claim 1 wherein the durable goods are identical in each tuple and each tuple contains durable goods different from other tuples, and the set of valid groups of durable goods in the matrix is defined as only one durable good per matrix tuple.

6. The method of claim 1 wherein the durable goods are different in each tuple, and the set of valid groups of durable goods in the matrix is defined as only one matrix tuple in its entirety.

7. The method of claim 6 wherein a durable good in one tuple is identical to one durable good in another tuple.

8. A method for employing a plurality of reusable reticles in an integrated circuit manufacturing process employing lithographic exposure of a semiconductor wafer comprising:
   providing a matrix of a plurality of reticles, each matrix comprising a plurality of tuples of reticles, each reticle tuple comprising one or more reticles;
   defining at least one set of valid groups of reticles in the matrix for use in a desired lithographic exposure process;
   defining a set of conditions for determining availability of all reticles in the valid groups in the lithographic exposure process;
   comparing the availability conditions to the reticles in the set of valid groups and eliminating valid groups which do not meet the availability conditions, leaving non-eliminated valid groups;
   defining a set of conditions for determining priority of all reticles in the non-eliminated valid groups in the lithographic exposure process;
   comparing the priority conditions to the reticles in the set of valid groups and ranking non-eliminated valid groups according to the priority conditions; and
   selecting for use in the lithographic exposure process reticles from the non-eliminated valid groups according to ranking by the priority conditions.

9. The method of claim 8 wherein the reticles from the non-eliminated valid groups are employed in lithographic exposure of a single process level of a semiconductor wafer.

10. The method of claim 8 wherein the valid groups of reticles in the matrix is determined by applying a rule of interpretation which depends on the type of manufacturing process.

11. The method of claim 8 wherein the reticles are identical in each tuple and each tuple contains reticles different from other tuples, and the set of valid groups of reticles in the matrix is defined as only one reticle per matrix tuple.

12. The method of claim 8 wherein the reticles are different in each tuple, and the set of valid groups of reticles in the matrix is defined as only one matrix tuple in its entirety.

13. The method of claim 12 wherein a reticle in one tuple is identical to one reticle in another tuple.

14. An article of manufacture comprising a computer usable medium having computer readable program code means embodied therein for employing a plurality of reusable durable goods in an integrated circuit manufacturing process, the plurality of durable goods being provided in a matrix comprising a plurality of tuples of durable goods, each durable goods tuple comprising one or more durable goods, said article comprising:
   computer readable program code means for defining at least one set of valid groups of durable goods in the matrix for use in a desired integrated circuit manufacturing process;
   computer readable program code means for defining at least one condition for determining availability of all durable goods in the valid groups in the desired manufacturing process;
   computer readable program code means for comparing the at least one availability condition to the durable goods in the set of valid groups and eliminating valid groups which do not meet the availability condition, leaving non-eliminated valid groups; and computer readable program code means for selecting for further comparison or use in the desired integrated circuit manufacturing process durable goods from the non-eliminated valid groups.

15. The article of claim 14 wherein the durable goods comprise lithographic reticles and the reticles from the non-eliminated valid groups are employed in lithographic exposure of a semiconductor wafer.

16. A program storage device readable by a machine, tangibly embodying a program of instructions executable by the machine to perform method steps for employing a plurality of reusable durable goods in an integrated circuit manufacturing process, the plurality of durable goods being provided in a matrix comprising a plurality of tuples of durable goods, each durable goods tuple comprising one or more durable goods, said method steps comprising:

defining at least one set of valid groups of durable goods in the matrix for use in a desired integrated circuit manufacturing process;

defining at least one condition for determining availability of all durable goods in the valid groups in the desired manufacturing process;

comparing the at least one availability condition to the durable goods in the set of valid groups and eliminating valid groups which do not meet the availability condition, leaving non-eliminated valid groups; and selecting for further comparison or use in the desired integrated circuit manufacturing process durable goods from the non-eliminated valid groups.

17. The device of claim 16 wherein the durable goods comprise lithographic reticles and the reticles from the non-eliminated valid groups are employed in lithographic exposure of a semiconductor wafer.

18. A method for employing a plurality of reusable durable goods in an integrated circuit manufacturing process comprising:

providing a matrix of a plurality of durable goods, each matrix comprising a plurality of tuples of durable goods, each durable goods tuple comprising one or more durable goods;

defining at least one set of valid groups of durable goods in the matrix for use in a desired integrated circuit manufacturing process;

defining at least one condition for determining availability of all durable goods in the valid groups in the desired manufacturing process;

comparing the at least one availability condition to the durable goods in the set of valid groups and eliminating valid groups which do not meet the availability condition, leaving non-eliminated valid groups;

defining at least one condition for determining priority of all durable goods in the non-eliminated valid groups in the desired manufacturing process;

assigning a weight to each condition for determining priority of the durable goods in the non-eliminated valid groups;

comparing the at least one weighted priority conditions to the durable goods in the set of valid groups and ranking non-eliminated valid groups according to weighted priority condition; and selecting for further comparison or use in the desired integrated circuit manufacturing process durable goods from the non-eliminated valid groups.

19. The method of claim 18 including a plurality of conditions for determining priority of all durable goods in the non-eliminated valid groups in the desired manufacturing process.

20. A method for employing a plurality of reusable reticles in an integrated circuit manufacturing process employing lithographic exposure of a semiconductor wafer comprising:

providing a matrix of a plurality of reticles, each matrix comprising a plurality of tuples of reticles, each reticle tuple comprising one or more reticles;

defining at least one set of valid groups of reticles in the matrix for use in a desired lithographic exposure process;

defining a set of conditions for determining availability of all reticles in the valid groups in the lithographic exposure process;

comparing the availability conditions to the reticles in the set of valid groups and eliminating valid groups which do not meet the availability conditions, leaving non-eliminated valid groups;

defining a set of conditions for determining priority of all reticles in the non-eliminated valid groups in the lithographic exposure process;

comparing the priority conditions to the reticles in the set of valid groups and ranking non-eliminated valid groups according to the priority conditions;

assigning a weight to each condition for determining priority of the reticles in the non-eliminated valid groups;

comparing the weighted priority conditions to the reticles in the set of valid groups and ranking non-eliminated valid groups according to weighted priority condition; and selecting for use in the lithographic exposure process reticles from the non-eliminated valid groups according to ranking by the priority conditions.

21. An article of manufacture comprising a computer usable medium having computer readable program code means embodied therein for employing a plurality of reusable durable goods in an integrated circuit manufacturing process, the plurality of durable goods being provided in a matrix comprising a plurality of tuples of durable goods, each durable goods tuple comprising one or more durable goods, said article comprising:

computer readable program code means for defining at least one set of valid groups of durable goods in the matrix for use in a desired integrated circuit manufacturing process;

computer readable program code means for defining at least one condition for determining availability of all durable goods in the valid groups in the desired manufacturing process;

computer readable program code means for comparing the at least one availability condition to the durable goods in the set of valid groups and eliminating valid groups which do not meet the availability condition leaving non-eliminated valid groups;

computer readable program code means for defining at least one condition for determining priority of all durable goods in the non-eliminated valid groups in the desired manufacturing process;

computer readable program code means for assigning a weight to each condition for determining priority of the durable goods in the non-eliminated valid groups computer readable program code means for comparing the at least one weighted priority conditions to the durable goods in the set of valid groups and ranking non-eliminated valid groups according to weighted priority condition; and computer readable program code means for selecting for further comparison or use in the desired integrated circuit manufacturing process durable goods from the non-eliminated valid groups.

22. The article of manufacture of claim 21 including computer readable program code means for defining a plurality of conditions for determining priority of all durable goods in the non-eliminated valid groups in the desired manufacturing process.

23. A program storage device readable by a machine, tangibly embodying a program of instructions executable by the machine to perform method steps for employing a plurality of reusable durable goods in an integrated circuit manufacturing process, the plurality of durable goods being provided in a matrix comprising a plurality of tuples of durable goods, each durable goods tuple comprising one or more durable goods, said method steps comprising:

- defining at least one set of valid groups of durable goods in the matrix for use in a desired integrated circuit manufacturing process;
- defining at least one condition for determining availability of all durable goods in the valid groups in the desired manufacturing process;
- comparing the at least one availability condition to the durable goods in the set of valid groups and eliminating valid groups which do not meet the availability condition, leaving non-eliminated valid groups;
- defining at least one condition for determining priority of all durable goods in the non-eliminated valid groups in the desired manufacturing process;
- assigning a weight to each condition for determining priority of the durable goods in the non-eliminated valid groups;
- comparing the at least one weighted priority conditions to the durable goods in the set of valid groups and ranking non-eliminated valid groups according to weighted priority condition; and
- selecting for further comparison or use in the desired integrated circuit manufacturing process durable goods from the non-eliminated valid groups.

24. The program storage device of claim 23 wherein said method steps include defining a plurality of conditions for determining priority of all durable goods in the non-eliminated valid groups in the desired manufacturing process.

* * * * *